United States Patent [19]
Morikawa et al.

[11] Patent Number: 5,949,111
[45] Date of Patent: Sep. 7, 1999

[54] SEMICONDUCTOR DEVICE AND FABRICATION PROCESS THEREFOR

[75] Inventors: Yoshinao Morikawa, Nara; Toshihisa Gotou, Hiroshima; Junichi Tanimoto, Nara, all of Japan

[73] Assignee: Sharp Kabushiki Kaisha, Osaka, Japan

[21] Appl. No.: 08/966,569

[22] Filed: Nov. 10, 1997

Related U.S. Application Data

[63] Continuation of application No. 08/600,607, Feb. 13, 1996, abandoned.

[30]       Foreign Application Priority Data

Feb. 21, 1995  [JP]  Japan ..................................... 7-031910
Jan. 31, 1996  [JP]  Japan ..................................... 8-015652

[51] Int. Cl.$^6$ ........................... H01L 29/76; H01L 29/94; H01L 31/062; H01L 31/113
[52] U.S. Cl. ........................... 257/369; 257/374; 257/368
[58] Field of Search .................................. 257/369, 374, 257/368, 309

[56]          References Cited

U.S. PATENT DOCUMENTS 4,682,408   7/1987  Takebayashi .
5,014,098   5/1991  Schlais et al. ........................... 257/369
5,041,895   8/1991  Contiero et al. ........................ 257/374

FOREIGN PATENT DOCUMENTS 4-273164   2/1992   Japan .

*Primary Examiner*—Stephen D. Meier
*Attorney, Agent, or Firm*—Nixon & Vanderhye P.C.

[57]              ABSTRACT

A semiconductor device formed on a semiconductor substrate; includes diffusion layers for source and drain regions formed in a surface portion of the semiconductor substrate. A gate electrode is formed on the semiconductor substrate with an intervening gate insulation film. An interlayer insulation film is formed on the gate electrode, and an interconnection layer is formed on the interlayer insulation film. The gate electrode is formed on at least a portion of the source and drain regions and on a channel region located between the source and drain regions. The gate electrode is electrically connected to the interconnection layer via a contact hole formed in the interlayer insulation film on the gate electrode.

7 Claims, 12 Drawing Sheets

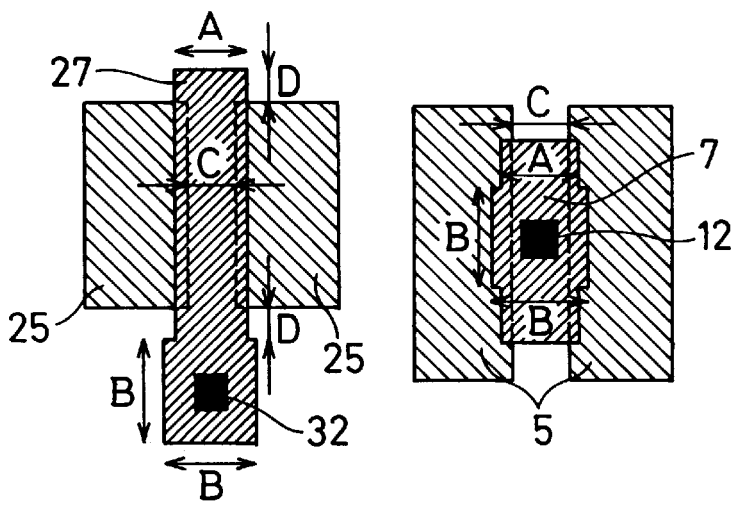
Fig. 6 (a)   Fig. 6 (b)
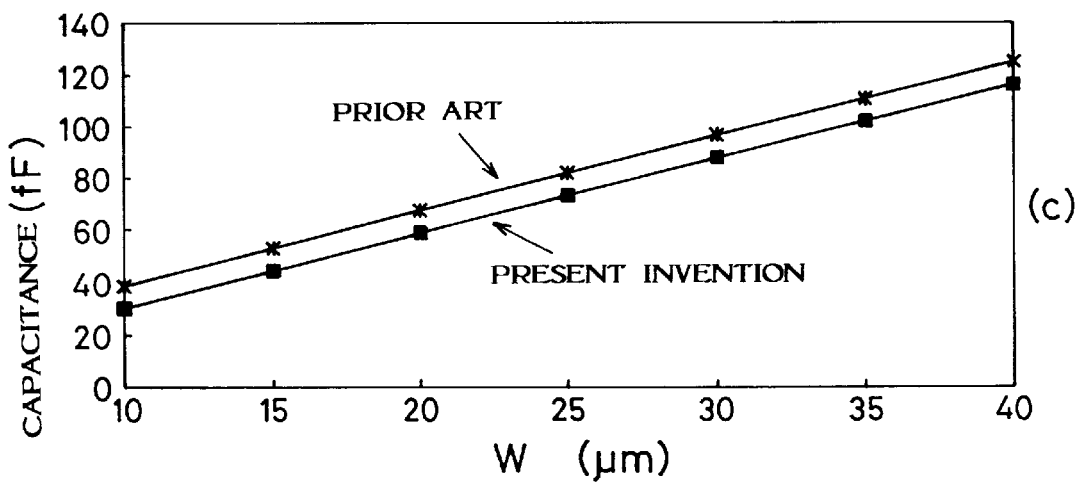
(c)
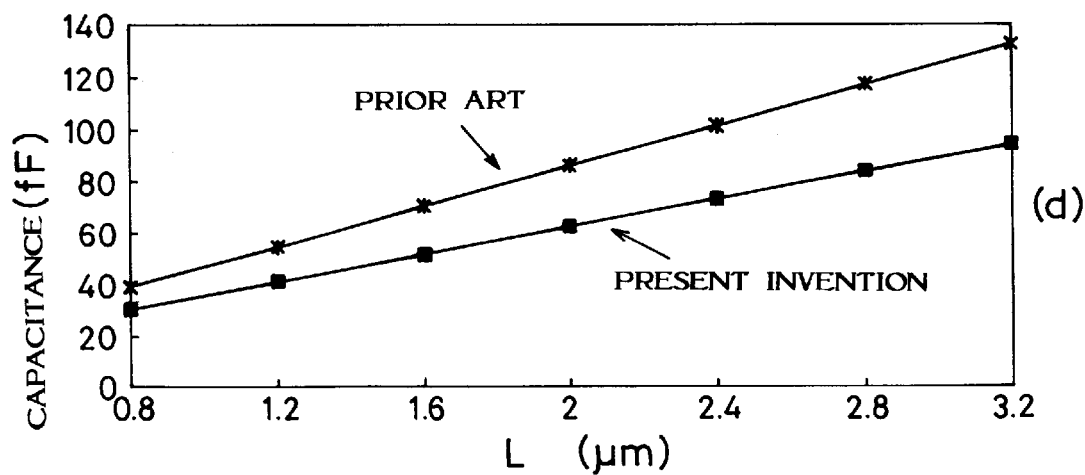
(d)

5,949,111

SEMICONDUCTOR DEVICE AND FABRICATION PROCESS THEREFOR

This is a continuation of application Ser. No. 08/600,607, filed Feb. 13, 1996, now abandoned.

BACKGROUND OF THE INVENTION

The present invention relates to a semiconductor device having a field effect transistor of insulated gate type and a fabrication process therefor.

FIG. 9(a) is a plan view illustrating a conventional field effect transistor of insulated gate type (hereinafter referred to as "MOSFET"), and FIG. 9(b) is a sectional view taken along a line X—X in FIG. 9(a). Referring to FIGS. 9(a) and 9(b), the MOSFET includes: source and drain regions each comprised of a diffusion layer 25 which is formed within a well 23 in a surface portion of a semiconductor substrate 21 by diffusing an impurity therein and has a conductivity type different from that of the well 23; and a channel region disposed below a gate electrode 27 between the source and drain regions in the surface portion of the semiconductor substrate 21.

The diffusion layer 25 is electrically connected to an interconnection layer 30 which has a greater conductivity than the diffusion layer 25 and a low resistance and exhibits a low capacitance with the semiconductor substrate. The gate electrode 27 to be disposed on the semiconductor substrate 21 with intervention of a gate insulation film 26 is formed of a lamination of polycrystalline silicon and a high melting-point metal or a high melting-point metal compound for reduction of the resistance thereof.

The MOSFET is typically fabricated in the following manner. The gate insulation film 26 is formed on the semiconductor substrate 21 formed with a LOCOS oxide film 28 in a predetermined region thereof. Thereafter, a gate electrode material is deposited on the resulting substrate and patterned to form the gate electrode 27. In turn, ions are implanted into a surface portion of the semiconductor substrate 21 self-aligned with the gate electrode 27 by using the gate electrode 27 as a mask to form the diffusion layer 25 for the source and drain regions.

As shown in FIG. 9(a), the gate electrode 27 is used as an interconnection layer. Therefore, the gate electrode 27 which extends to another MOSFET is electrically connected to another interconnection layer 30 in a region other than the channel region via a contact hole 32 formed in an interlayer insulation film 29.

Subsequently, the entire surface of the resulting semiconductor substrate 21 is coated with an overcoat layer 31 to complete the MOSFET.

FIG. 10(a) illustrates a conventional layout of two MOSFETs connected to each other. FIGS. 10(b) and 10(c) are sectional view taken along lines X—X and Y—Y, respectively, in FIG. 10(a). As shown in FIGS. 10(a) and 10(b), the LOCOS oxide film is typically used for element isolation of the two MOSFETs.

In the prior art, the gate electrode 27 is formed on the element isolation region as well as on the channel region as shown in FIGS. 9(a) and 10(a), and used as an interconnection layer for interconnecting the gates of the MOSFETs.

The element isolation is typically achieved by way of selective oxidation by an LOCOS method known in the art. However, a bird beak is produced, thereby hindering device micronization. Level differences produced by an LOCOS oxide film 28 as shown in FIG. 10(c) may cause the breakage or a short of the interconnection layer of the gate electrode 27 formed on the LOCOS oxide film 28.

To solve the aforesaid problem associated with the element isolation by the LOCOS method, the provision of an ion-implanted region is proposed for the element isolation. Instead of the LOCOS oxide film 28 shown in FIG. 10(c), a film is formed along with the gate insulation film 26 on the semiconductor substrate, and an ion-implanted region for element isolation is formed below the film. This means that the gate electrode is also formed on the ion-implanted region with intervention of the gate insulation film.

Therefore, the gate capacitance introduced between the gate electrode and the semiconductor substrate cannot be ignored. As the semiconductor device is further micronized and has a thinner gate insulation film, the gate capacitance is remarkably increased. Further, an element isolation withstand voltage may be reduced due to an influence of a voltage applied to the interconnection layer of the gate electrode present on the ion-implanted region. Therefore, the amount of ions to be implanted into the region has to be increased to increase the element isolation withstand voltage. This reduces a junction withstand voltage, thereby further increasing the parasitic capacitance.

In case of a complementary MOSFET, as shown in FIGS. 11(a) and 11(b), gate electrodes 27 can be formed as extending across an N-channel MOSFET 43 in a P-type well 41, and a P-channel MOSFET 42 in an N-type well 40 with an LOCOS oxide film 28 is provided on a semiconductor substrate.

Where the element isolation is achieved by forming an ion-implanted region instead of the LOCOS oxide film 28 as shown in FIG. 12(a), however, there exists only a thin gate insulation film 26 between the gate electrode 27 and the semiconductor substrate. The gate electrode 27 extends from the P-channel MOSFET 42 to the N-channel MOSFET 43 beyond the boundary of the N-type well 40 and the P-type well 41. The relationship between the channel inversion voltage and the impurity concentration in a surface portion of a well is shown in FIG. 12(b). FIG. 12(b) indicates that the direction of current flow in the surface portion of the well may be inverted depending on a voltage applied to the gate electrode, and as a result, a leakage current path is produced. This undermines the reliability of the semiconductor device.

Where two gate electrodes 27 are disposed side by side in a conventional MOSFET as shown in FIG. 2(b), it is impossible for structural reasons to form an interconnection layer extending across source and drain regions. Therefore, the gate electrodes 27 must be connected to the interconnection layer 30 in a region other than a diffusion region. This limits the flexibility of device layout.

To meet the need for semiconductor device micronization, the length of a gate may be reduced to less than 0.5 µm, for example. MOSFET using a conventional gate self-alignment method makes it difficult to ensure an alignment margin on the gate electrode having a length of less than 0.5 µm in order to form a contact hole on the gate.

SUMMARY OF THE INVENTION

The present invention provides a semiconductor device formed on a semiconductor substrate. Diffusion layers for source and drain regions are formed in a surface portion of the semiconductor substrate. A gate electrode is formed on the semiconductor substrate with an intervening of a gate insulation film. An interlayer insulation film formed on the gate electrode, and an interconnection layer is formed on the interlayer insulation film. The gate electrode is formed on at least a portion of the source and drain regions and on a channel region located between the source and drain regions. The gate electrode is electrically connected to the interconnection layer via a contact hole formed in the interlayer insulation film on the gate electrode.

The present invention provides a process for fabricating a semiconductor device comprising the steps of:

(a) implanting an impurity into a semiconductor substrate to form a diffusion layer for source and drain regions in a surface portion of the semiconductor substrate;

(b) forming a gate insulation film on the entire surface of the resulting semiconductor substrate, followed by the formation of a gate electrode on at least a portion of the source and drain regions and on a channel region located between the source and drain regions by depositing a gate electrode material on the gate insulation film and patterning the gate electrode material;

(c) forming an interlayer insulation film on the entire surface of the resulting substrate, followed by the formation of a contact hole in the interlayer insulation film on the gate electrode; and (d) forming an interconnection layer on the interlayer insulation film so as to electrically connect the gate electrode to the interconnection layer via the contact hole.

BRIEF DESCRIPTION OF THE DRAWINGS

FIGS. 6(a) and 6(b) are plan views illustrating semiconductor devices in accordance with the present invention and in the prior art, respectively;

FIG. 6(c) is a graphical representation illustrating the relationship between the gate capacitance and the width (W) of a gate electrode for the semiconductor devices shown in FIGS. 6(a) and 6(b);

FIG. 6(d) is a graphical representation illustrating the relationship between the gate capacitance and the length (L) of the gate electrode for the semiconductor devices shown in FIGS. 6(a) and 6(b);

DETAILED DESCRIPTION OF THE PREFERRED EMBODIMENTS

Figure 1:
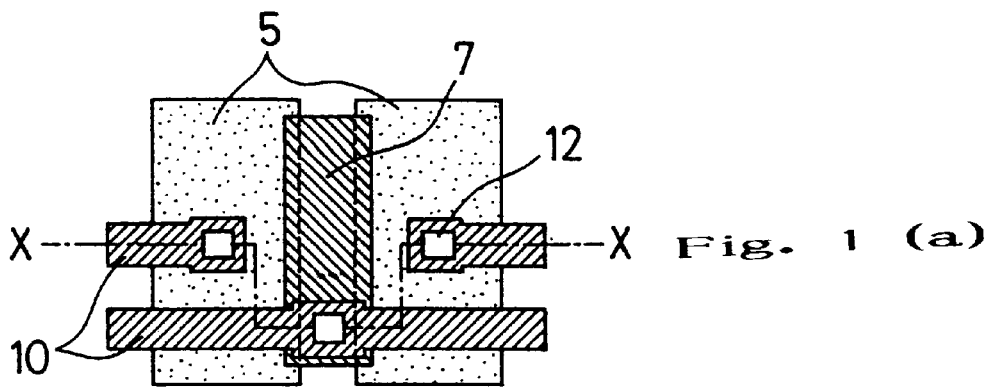
FIG. 1(a) is a plan view illustrating a semiconductor device in accordance with one embodiment of the present invention.
FIG. 1(b) is a sectional view taken along a line X—X in FIG. 1(a)
FIG. 1(c) is a plan view illustrating a variation of the FIG. 1(a) embodiment.
Figure 1:
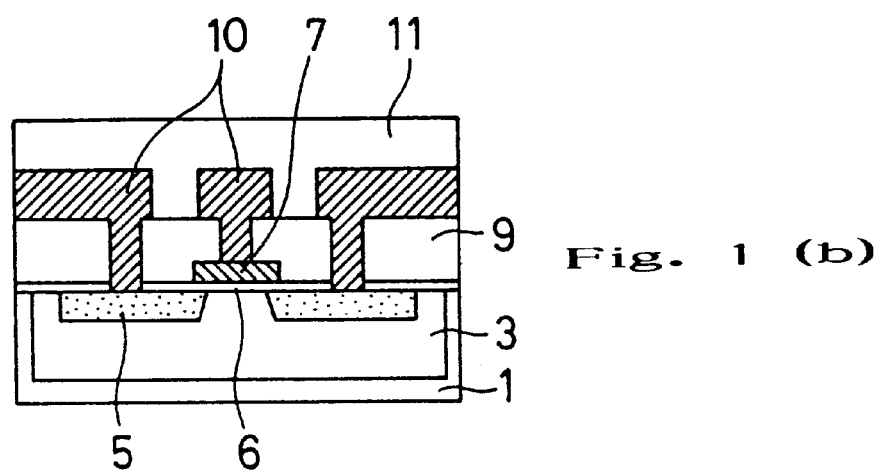
Figure 1:
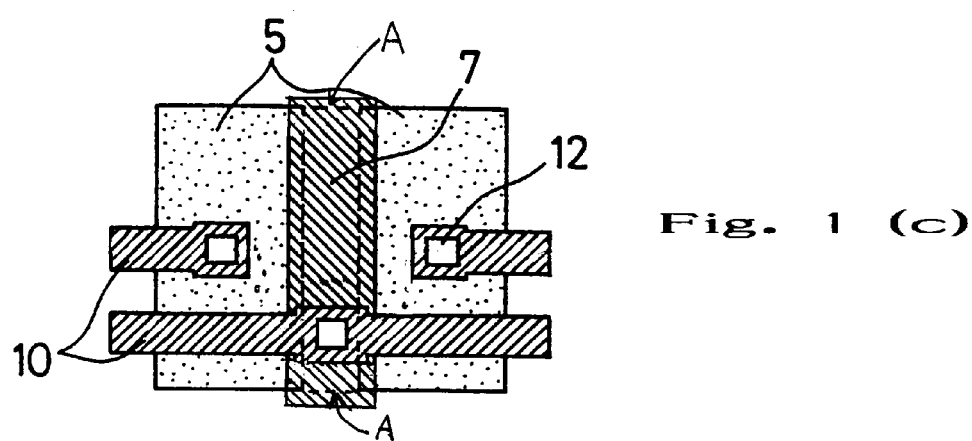

The semiconductor device of the present invention and a fabrication process therefor allows for reduction in gate capacitance and the formation of a contact hole on a gate electrode to meet device micronization requirements and to improve the layout flexibility and device integration.

Examples of semiconductor substrates to be used in the present invention include a silicon substrate, a GaAs substrate and the like which are known in the art. The semiconductor substrate may be preliminarily imparted with a P-type or N-type conductivity. Exemplary impurities for the P-type conductivity include boron and the like. Exemplary impurities for the N-type conductivity include phosphorus, arsenic and the like.

A diffusion layer for source and drain regions are formed in a surface portion of the semiconductor substrate. Exemplary impurities used for the formation of the diffusion layer include boron and the like for the P-type conductivity, and phosphorus, arsenic and the like for the N-type conductivity. For example, arsenic is preferably implanted into the semiconductor substrate with a dose of $3 \times 10^{15}/cm^2$ to $5 \times 10^{15}/cm^2$ at an acceleration energy of 30 KeV for the formation of the diffusion layer.

A gate electrode is formed at least on a channel region between the source and drain regions with intervention of a gate insulation film. One of the features of the present invention is that the gate electrode is formed only on the diffusion layer and the channel region. In other words, each MOSFET has a gate electrode, and a portion below the gate electrode serves as a channel region.

Exemplary materials for the gate insulation film include a silicon oxide film and a silicon nitride film, and lamination of these films. The thickness of the gate insulation film is preferably in the range from about 10 nm to about 30 nm.

Exemplary materials for the gate electrode include polysilicon, silicides of high melting-point metals such as Ti and W, lamination of these silicides, and metal films such as of Al and Au. The thickness of the gate electrode is preferably in the range from about 150 nm to about 300 nm. Where the gate electrode is made of polysilicon, an impurity may be implanted therein to reduce the resistance thereof. The gate electrode preferably has a length greater than the length of the channel for preventing the formation of an offset area. Here, an impurity may be implanted into the channel region to control threshold voltage.

An interlayer insulation film is formed on the gate electrode. The gate electrode is electrically connected to an interconnection layer via a contact hole formed in the interlayer insulation film on the gate electrode.

Exemplary materials for the interlayer insulation film include a silicon oxide, a silicon nitride, a PSG, a BPSG, an SOG, and lamination of any of these. Considering the influence of the interconnection layer on the semiconductor substrate, the thickness of the interlayer insulation film may be greater than 1,000 Å, and typically 4,000 Å to 6,000 Å. Exemplary materials for the interconnection layer include metals such as A1, A1/Si and Cu.

An overcoat layer is preferably formed on the entire surface of the resulting substrate to protect the semiconductor device from contamination, moisture and mechanical damage. Exemplary materials for the overcoat film include a silicon nitride, a PSG and an SiON.

In the semiconductor device of the present invention which has the aforesaid construction, the size of the gate electrode can be reduced in comparison with the conventional semiconductor device and, therefore, the gate capacitance can be reduced. Further, in accordance with the following fabricating process of the present invention, the gate electrode is connected to the interconnection layer on the channel region, so that the size of the semiconductor device can be reduced. In addition, the interconnection layer connected to the gate electrode can be formed on the diffusion layers with an intervening interlayer insulation film. Therefore, the layout flexibility is increased, enhancing the integration of the semiconductor device.

A plurality of the elements, as described above may be formed in parallel or in series on a single semiconductor substrate. In such a case, a region for electrically isolating adjacent elements from each other (an element isolation region) is provided between the elements. The element isolation region is provided, for example, as a silicon (LOCOS) oxide film formed by a LOCOS method, or as an impurity region for element isolation formed by impurity implantation. Since there is no gate electrode formed on the element isolation region and there is an interlayer insulation film formed under the interconnection layer in accordance with the present invention, the element isolation achieved by the formation of the impurity region does not result in an increased gate capacitance.

The impurity region formed as the element isolation region by implanting an impurity into a surface layer of the semiconductor substrate is preferable because the resulting semiconductor device has a relatively flat surface, e.g., smaller level differences. The impurity concentration in the impurity region is determined taking into account the withstand voltage of the element isolation region formed between the elements.

The present invention can be applied to any semiconductor device having a gate electrode and a diffusion layer. Such a semiconductor device may be formed, for example, in a well that is formed in a semiconductor substrate having a predetermined impurity concentration. More specific examples of such semiconductor devices include NMOS, PMOS, and CMOS devices.

A process for fabricating a semiconductor device in accordance with the present invention is now described. A diffusion layer for source and drain regions is formed in a surface portion of a semiconductor substrate by ion implantation using a photoresist film with a predetermined pattern as a mask. After the mask is removed, a gate insulation film is formed on the entire surface of the substrate, and a gate electrode material is deposited on the gate insulation film. The formation of the gate insulation film is achieved by a sputtering method, a CVD method, a thermal oxidation method or the like. The deposition of the gate electrode material is achieved by a CVD method, a vapor deposition method or the like.

The gate electrode material is patterned to form a gate electrode at least on a channel region between the source and drain regions. The patterning of the gate electrode material can be achieved by known lithographic and etching techniques. During the patterning, it is preferred that cure be taken to avoid forming an offset area between the gate electrode and the source and drain regions.

After an interlayer insulation film is formed on the entire surface of the resulting substrate, a contact hole is formed in the interlayer insulation film on the gate electrode. The formation of the interlayer insulation film is achieved by a CVD method, a thermal oxidation method or the like. The formation of the contact hole is achieved by depositing a mask having an opening in a desired position on the gate electrode and etching part of the interlayer insulation film.

Thereafter, an interconnection layer is formed on the interlayer insulation film, and the gate electrode is electrically connected to the interconnection layer via the contact hole to complete the semiconductor substrate of the present invention. The formation of the interconnection layer is achieved by known lithographic and etching techniques after depositing an interconnection layer material by a vapor deposition method, a CVD method or the like.

Where a plurality of elements are formed on a single substrate by the fabrication method of the present invention, element isolation regions are preferably formed by way of impurity implantation using a photoresist film having openings in regions between adjacent elements where element isolation regions are to be formed. Moreover, the isolation regions are preferably formed before the formation of the interlayer insulation film and after the formation of the gate electrode. The element isolation regions allow for the fabrication of relatively flat semiconductor devices which are free from a discontinous interconnection layer and/or an increase in the gate capacitance. Where boron is used as an impurity for the formation of the element isolation regions, for example, the impurity implantation is performed at an acceleration energy of 20 KeV with a dose of $1\times10^{13}$ to $5\times10^{13}/cm^2$.

EXAMPLES

The present invention will be described in detail by way of example embodiments thereof.

Example 1

Figure 2:
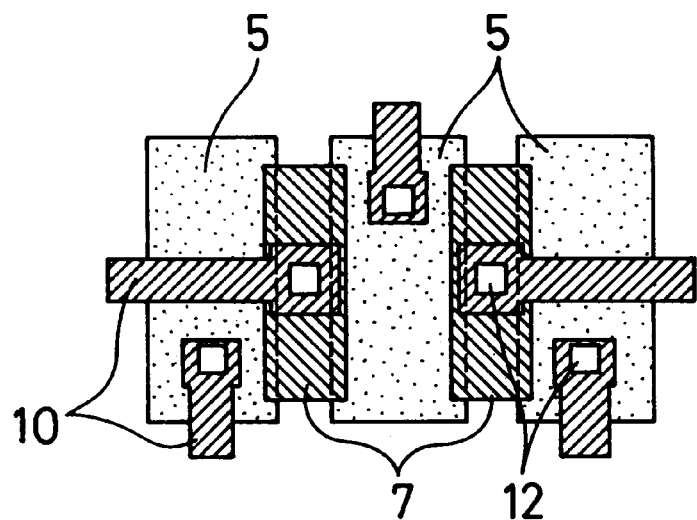
FIGS. 2(a) and 2(b) are plan views illustrating gate electrodes disposed side by side in accordance with the present invention and in the prior art, respectively.
Figure 2:
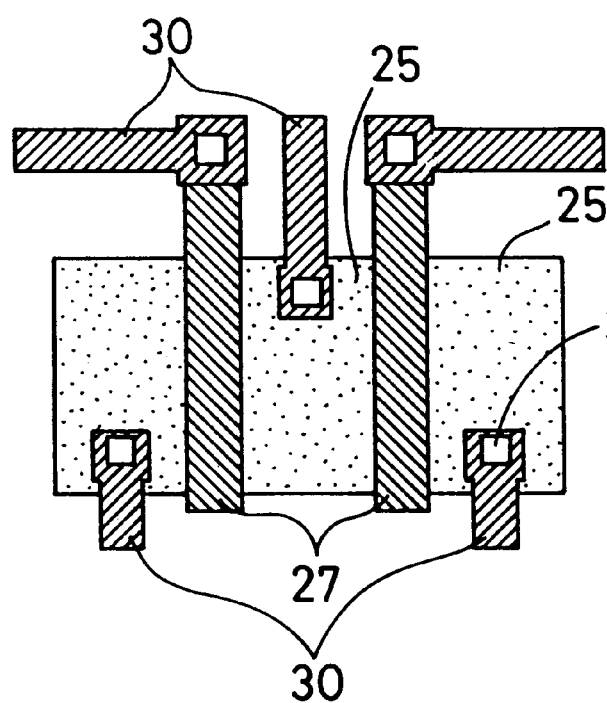
Figure 3:
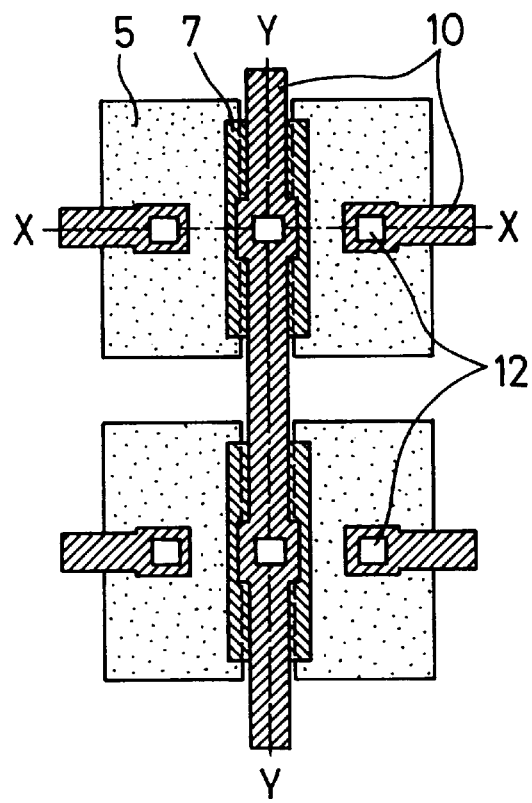
FIG. 3(a) is a plan view illustrating two MOSFETs connected to each other in accordance with the embodiment of the present invention.
FIGS. 3(b) and 3(c) are sectional views taken along lines X—X and Y—Y, respectively, in FIG. 3(a)
Figure 3:
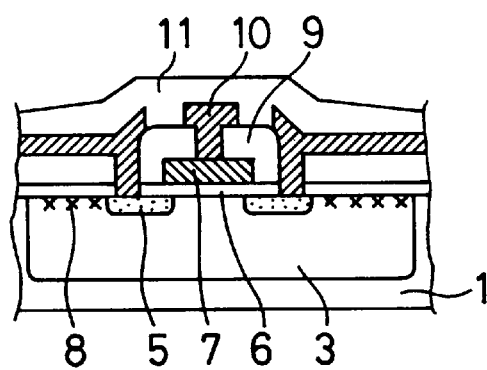
Figure 3:
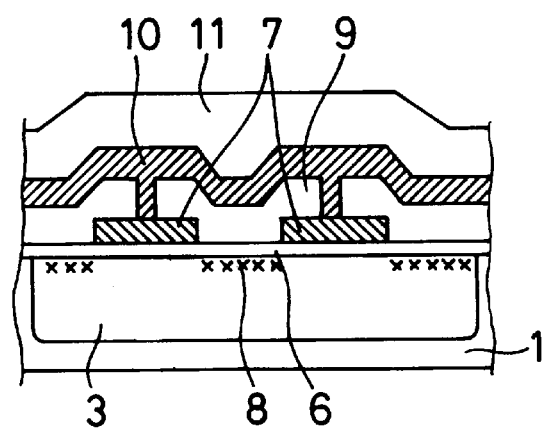

FIG. 1(a) is a plan view illustrating a semiconductor device in accordance with one embodiment of the present invention, and FIG. 1(b) is a sectional view taken along a line X—X in FIG. 1(a). FIG. 1(c) is a variation of the exemplary embodiment shown in FIG. 1(a). FIGS. 2(a) and 2(b) are plan views illustrating gate electrodes disposed side by side in accordance with the present invention and in the prior art, respectively. FIG. 3(a) is a plan view illustrating two MOSFETs where gates thereof are connected to each other in accordance with the embodiment of the present invention. FIGS. 3(b) and 3(c) are sectional views taken along lines X—X and Y—Y, respectively, in FIG. 3(a). FIGS. 4(a) to (g) are sectional views for illustrating a process for fabricating the semiconductor device of FIG. 3(a) which is taken along the line X—X. FIGS. 5(a) to 5(g)

are sectional views for illustrating a process for fabricating the semiconductor device of FIG. 3(a).

In these figures, reference numerals 1 to 12 denote the following components: 1 a semiconductor substrate; 2 a silicon oxide film; 3 a well; 4a to 4d resists; 5 diffusion layers for source and drain regions; 6 a gate insulation film; 7 a gate electrode; 8 a device isolation region; 9 an element insulation film; 10 an interconnection layer; 11 an overcoat film; and 12 a contact hole.

A semiconductor device according to EXAMPLE 1 includes diffusion layers 5 for source and drain regions and a gate electrode 7 which is formed on a channel region and does not serve as an interconnection layer for interconnection of semiconductor devices. A contact hole 12 for electrically connecting the gate electrode 7 to the interconnection layer 10 is formed on the gate electrode 7. Since the length of the interconnection by the gate electrode is short, delay time can be minimized. Therefore, even if the element isolation region 8 is defined by an impurity region which is formed instead of an LOCOS oxide film by implanting ions into the semiconductor substrate 1, the conventional problems associated with the gate capacitance which may otherwise be introduced between the gate electrode 7 and the device isolation region 8 are avoided because the interconnection layer 10 is formed on the device isolation region 8 with intervention of the interlayer insulation film 9.

With reference to FIGS. 4(a) to (g) and 5(a) to 5(g), there will be described a process for fabricating a semiconductor device in accordance with another embodiment of the present invention. While an N-channel MOSFET is described in this embodiment, the present invention is not limited thereto.

An about 14 nm-thick silicon oxide film 2 is formed on a surface of a P-type silicon substrate 1. In turn, boron ions are implanted into the silicon substrate 1 with a dose of about $5 \times 10^{12}/cm^2$ at an acceleration energy of about 36 KeV, and then the substrate 1 is subjected to a heat treatment to form a well 3 having a depth of about 1.5 µm to about 2.0 µm for the formation of an N-channel MOSFET (see FIGS. 4(a) and 5(a)).

Subsequently, a resist 4a is formed by a lithographic technique into a pattern such that intended source and drain regions are exposed. Then, arsenic ions (N-type impurity) are implanted into the semiconductor substrate 1 with a dose of about $3 \times 10^{15}/cm^2$ at an acceleration energy of about 40 KeV to form diffusion layers 5 (see FIGS. 4(b) and 5(b)).

After the resist 4a and the silicon oxide film 2 are removed and an about 14 nm-thick gate insulation film 6 is formed by a thermal oxidation method, lamination of polycrystalline silicon and a high melting-point metal or a high melting-point metal compound such as tungsten silicide is formed as a gate electrode material by a CVD method. After a resist 4b deposited, the gate electrode material is patterned by a lithographic technique. The gate electrode material is dry-etched by using the resist 4b as a mask to form a gate electrode 7 (see FIGS. 4(c) and 5(c)). To prevent the formation of an offset area between the source and drain regions and the gate electrode 7, the gate electrode 7 is formed in such a size that an overlap, for example, of greater than 0.2 µm is formed on the source and drain regions. More specifically, where the designed channel length of the MOSFET is 0.8 µm, the length of the gate electrode measured along the channel should be greater than 1.2 µm.

Figure 4:
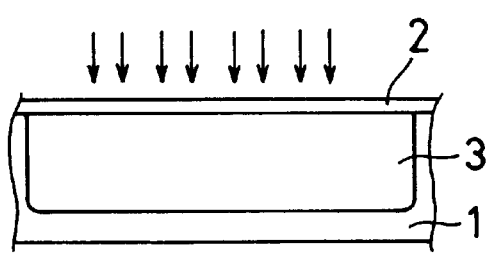
FIGS. 4(a) to (g) are sectional views for illustrating a process for fabricating the semiconductor device of FIG. 3(a) which is taken along the line X—X.
Figure 4:
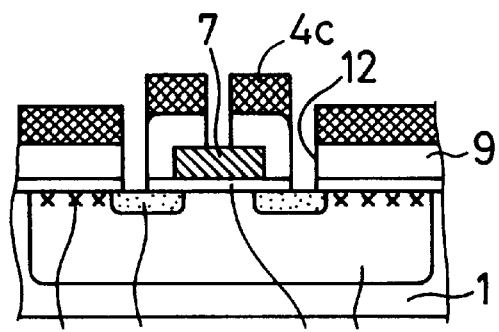
Figure 4:
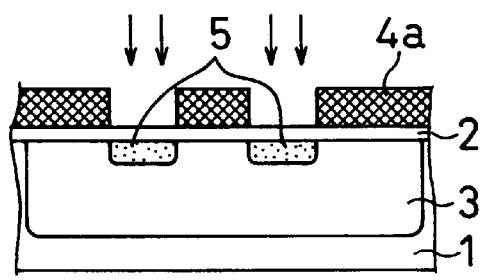
Figure 4:
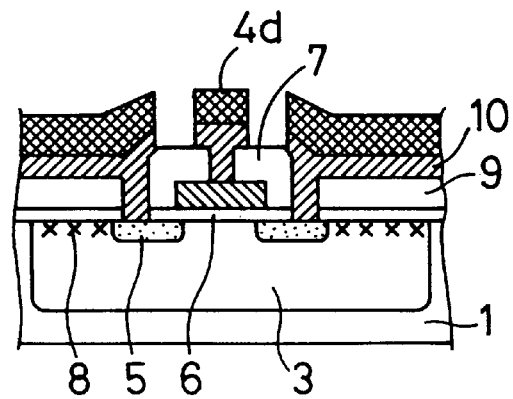
Figure 4:
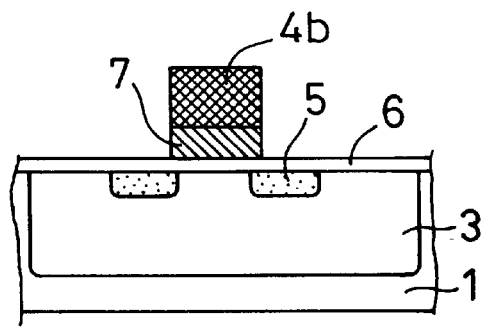
Figure 4:
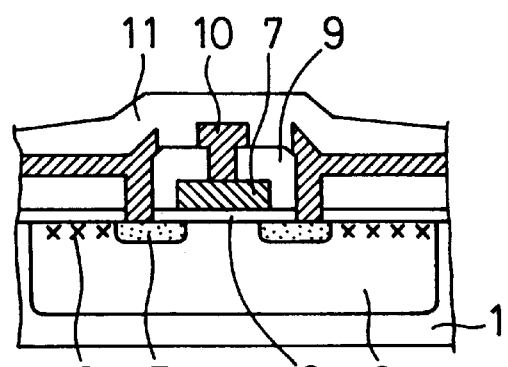
Figure 4:
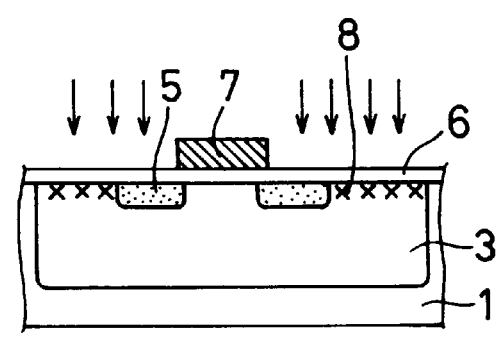
Figure 5:
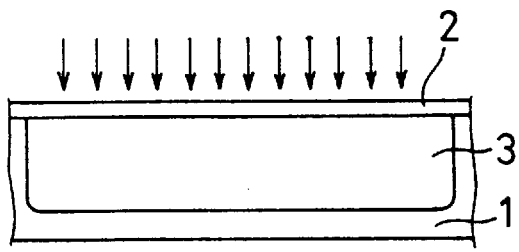
FIGS. 5(a) to 5(g) are sectional views for illustrating the process for fabricating the semiconductor device of FIG. 3(a) which is taken along the line Y—Y.
Figure 5:
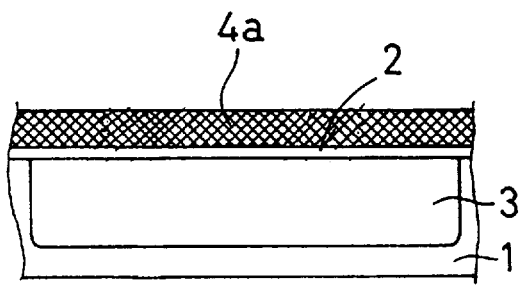
Figure 5:
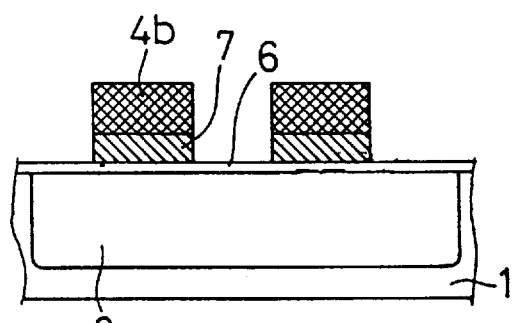
Figure 5:
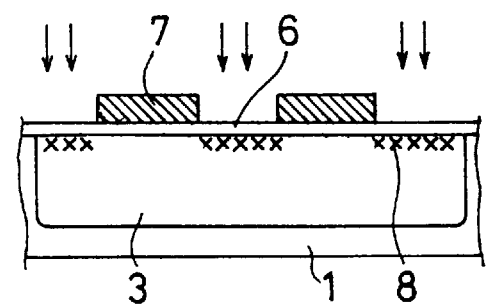
Figure 5:
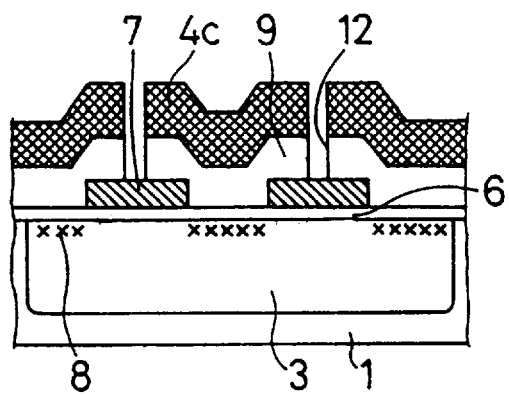
Figure 5:
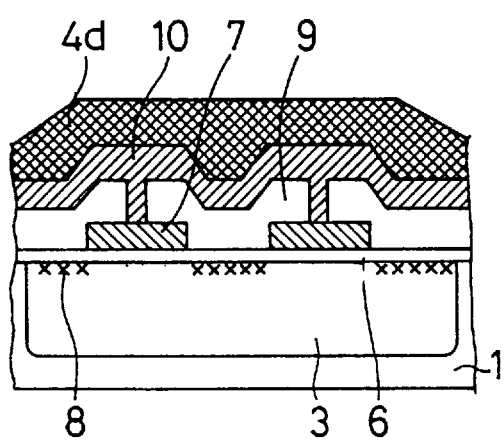
Figure 5:
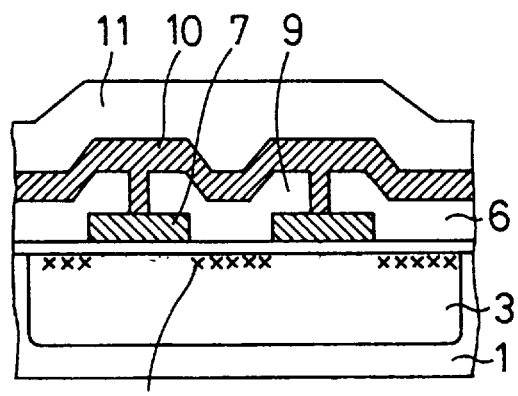

Using the gate electrode as a mask, boron ions are implanted into the semiconductor substrate 1 with a dose of about $3.2 \times 10^{13}/cm^2$ at an acceleration energy of about 30 KeV to form element isolation regions 8 (see FIGS. 4(d) and 5(d)). For the ion implantation formation of the element isolation regions 8, the gate electrode 7 may be used as a mask or, alternatively, a mask pattern having openings on the element isolation regions may be formed on the substrate. Where the ions are implanted with use of the gate electrode as the mask, edge portions of the gate electrode partially overlap the element isolation regions. If it is desired to avoid the overlapping, the ion implantation may be performed after a side wall spacer is formed of an insulation film on the side walls of the gate electrode 7. At this time, the ions are also implanted into the source and drain regions. However, this does not cause a problem because the impurity has been implanted into the source and drain regions in a high concentration. Thereafter, an interlayer insulation film 9 is formed by a known CVD method. After a resist 4c deposited on the interlayer insulation film 9 is patterned by a lithographic technique, a contact hole 12 is formed by an etching technique (see FIGS. 4(e) and 5(e)).

After the resist 4c is removed, an interconnection material is deposited on the resulting substrate by a sputtering method. After a resist 4d deposited on the interconnection material is patterned by a lithographic technique, an interconnection layer 10 is formed (see FIGS. 4(f) and 5(f)). An overcoat film 11 is formed on the resulting substrate for the protection of the MOSFET from contamination, moisture and mechanical damage (see FIGS. 4(g) and 5(g)). Thus, the semiconductor device is completed.

Figure 9:
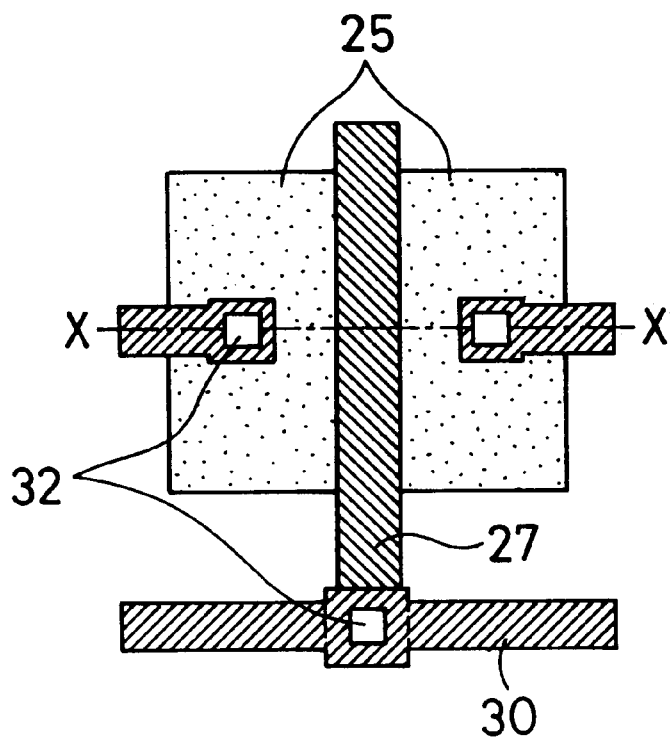
FIG. 9(a) is a plan view illustrating a conventional field effect transistor of insulated gate type.
FIG. 9(b) is a sectional view taken along a line X—X in FIG. 9(a)
Figure 9:
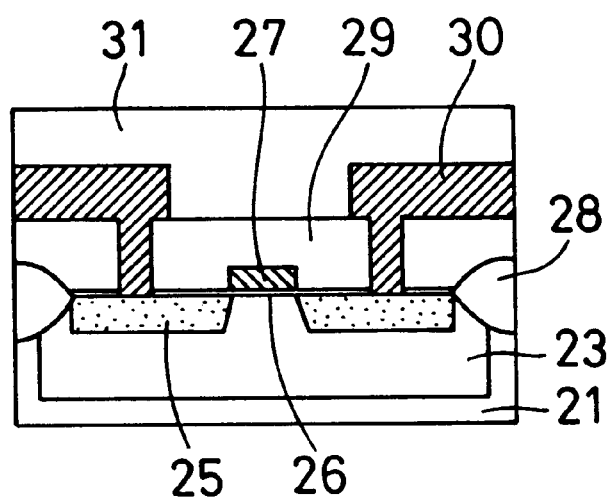
Figure 10:
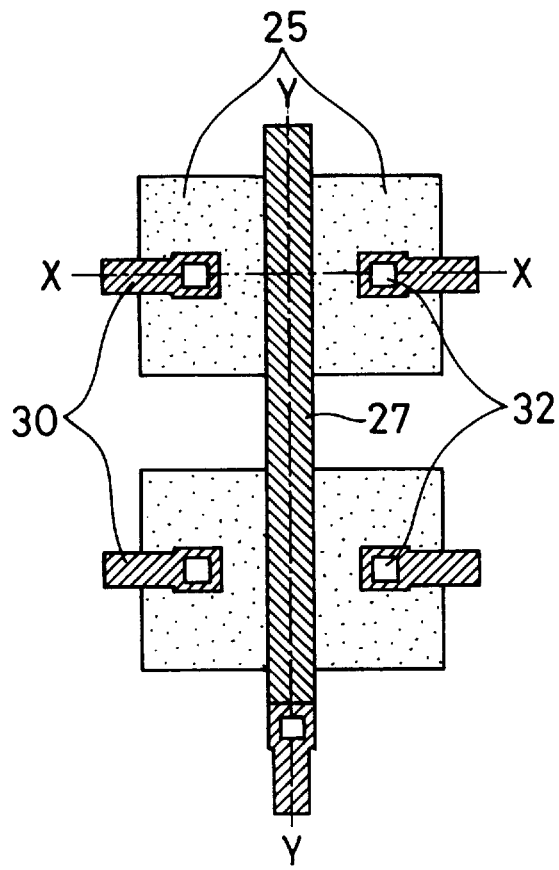
FIG. 10(a) is a plan view illustrating two conventional MOSFETs connected to each other.
FIGS. 10(b) and 10(c) are sectional views taken along lines X—X and Y—Y, respectively, in FIG. 10(a)
Figure 10:
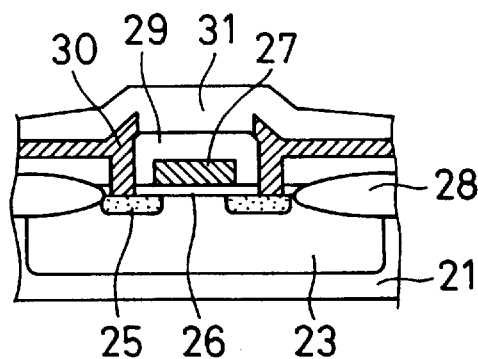
Figure 10:
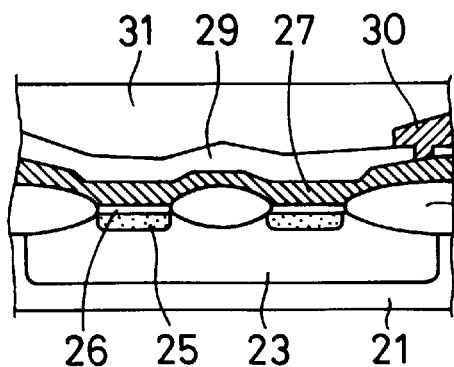
Figure 11:
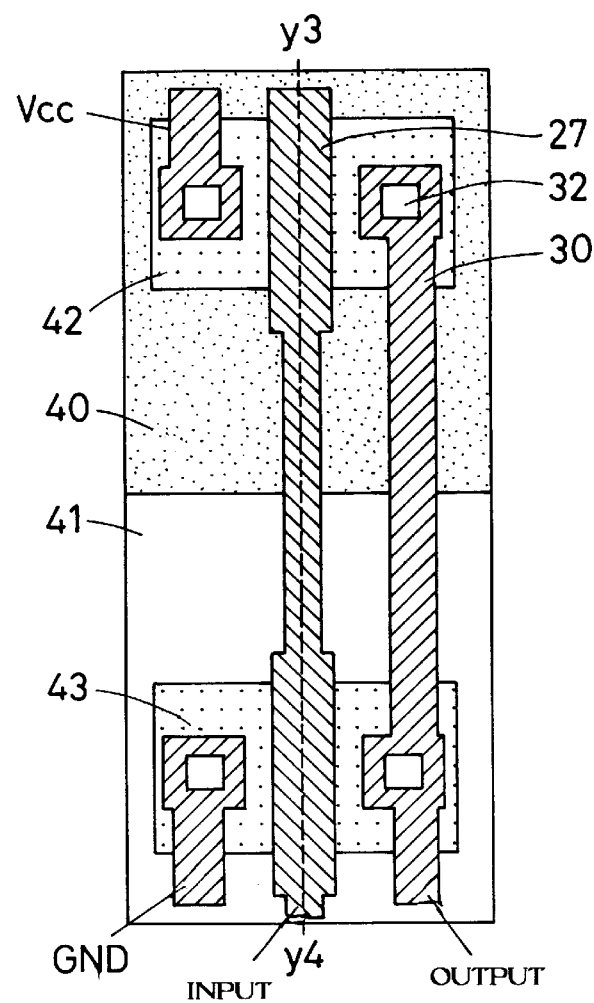
FIG. 11(a) is a plan view illustrating an invertor of COMS structure in the prior art.
FIG. 11(b) is a sectional view taken along a line Y3-Y4 in FIG. 11(a)
Figure 11:
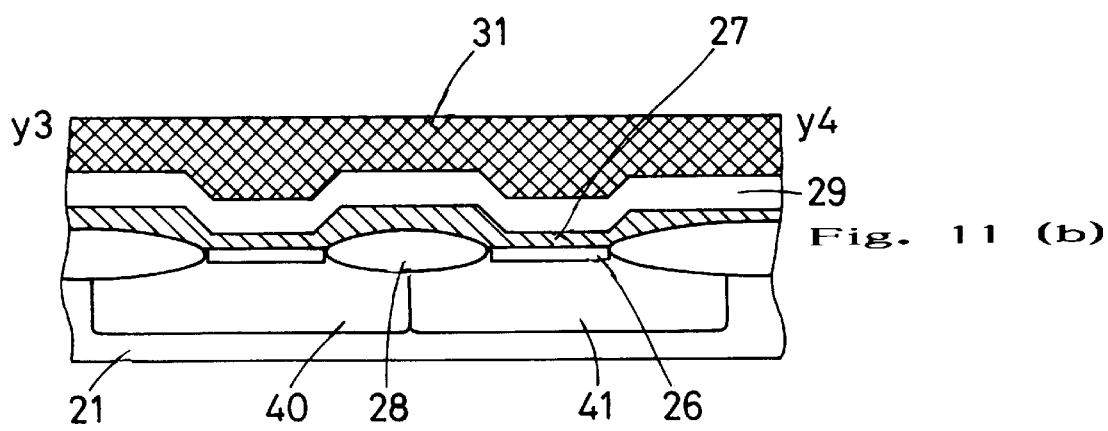
Figure 12:
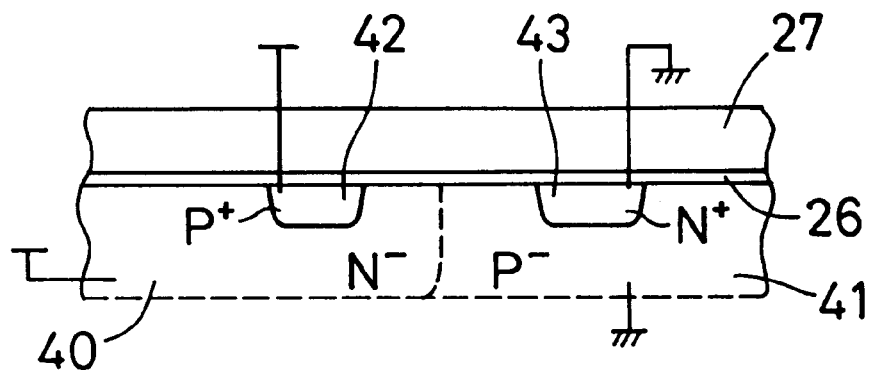
FIG. 12(a) is a sectional view illustrating the invertor of CMOS structure in the prior art.
FIG. 12(b) is a graphical representation illustrating the relationship between the channel inversion voltage and the impurity concentration in a surface portion of a well of the invertor shown in FIG. 12(a).
Figure 12:
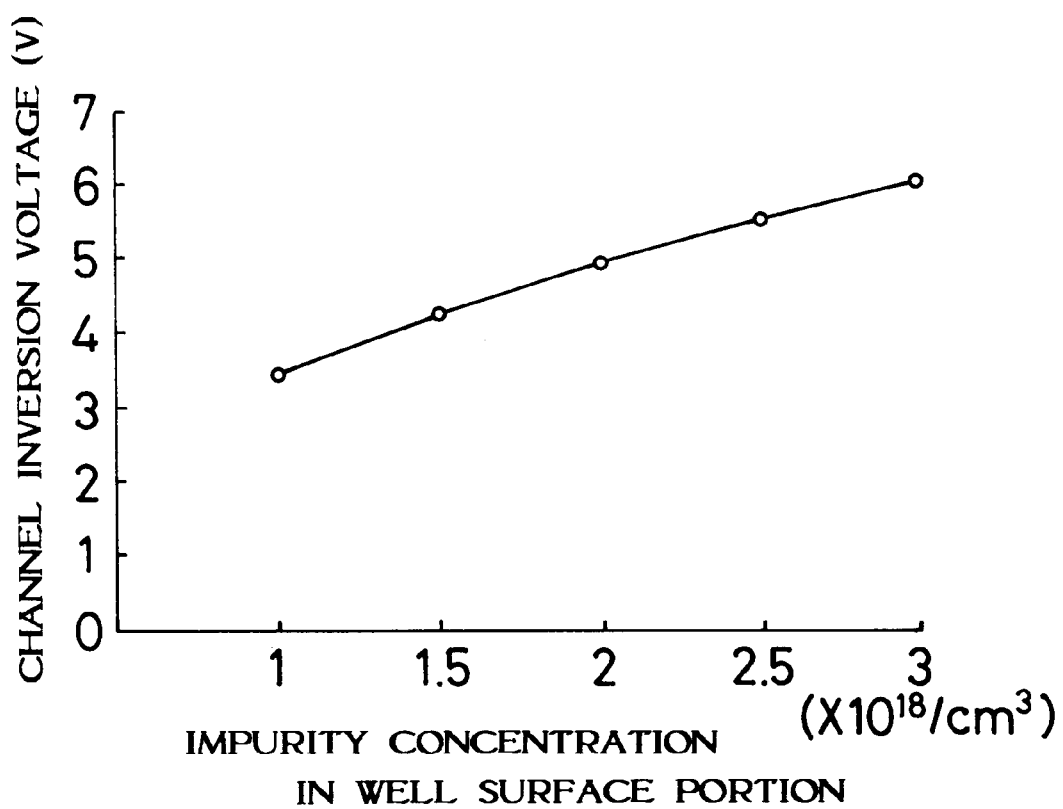

Next, the semiconductor device of the present invention will be compared with the conventional semiconductor device shown in FIGS. 9(a) and 9(b). FIG. 6(a) is used instead of FIG. 9(a) for the explanation of the conventional semiconductor device, and FIG. 6(b) is used for the explanation of the semiconductor device of the present invention.

The conventional semiconductor device having a gate electrode laid out as shown in FIG. 6(a) has a gate capacitance of about 0.05 pF, where the element isolation is achieved by ion implantation; the length A of the gate electrode 27 measured along the channel is 0.8 µm; the width of the gate electrode 27 measured perpendicular to the channel is 10 µm; the length D of a portion of the gate electrode 27 projected out of the channel region is 1 µm (which is designed in consideration of an alignment margin of the gate electrode 27 in a direction perpendicular to the channel); the size of a portion of the gate electrode 27 where the contact hole 32 is formed for the connection between the gate electrode 27 and the interconnection layer 30 is 1.4 µm×1.4 µm; and the thickness of the insulation film formed below the gate electrode 27 is 14 nm. It should be noted that reference character C denotes the length of the channel.

On the other hand, the semiconductor device of the present invention shown in FIG. 6(b) has a gate capacitance of about 0.035 pF, where the width A of the gate electrode 27 measured along the channel is 1.2 µm. Even if the length A of the gate electrode 27 is increased from 0.8 µm to 1.2 µm in consideration of an alignment margin for the source and drain regions, the gate capacitance is reduced by an amount which is attributed to the portion of the gate electrode 27 projected out of the channel region (D: 1µm) and the portion of the gate electrode 27 where the contact hole 32 is formed (B×B: 1.4 µm×1.4 µm). The gate capacitance can be reduced by about 30% per transistor. Therefore, the present invention is particularly useful, for example, where one million transistors are incorporated in a highly integrated manner.

FIG. 6(c) shows the relationship between the gate capacitance and the width (W) of the gate electrode for the semiconductor devices of the prior art and the present invention where the dimensions of the gate electrodes are substantially the same except the widths of the gate electrodes measured perpendicular to the direction of the current (channel direction) to the channels. FIG. 6(d) shows the relationship between the gate capacitance and the length (L) of the gate electrode for the semiconductor devices of the prior art and the present invention where the dimensions of the gate electrodes are substantially the same except the lengths of the gate electrodes measured along the channel direction. In accordance with the present invention, the gate capacitance can be reduced in comparison with the prior art irrespective of the W and L of the gate electrode, as shown in FIGS. 6(c) and 6(d).

In FIG. 1(a), the gate electrode does not convert all of the portion between the source and drain regions, so that micronization of the device might possibly cause insufficient channel width. In such a case, the gate electrode 7 may be allowed to overlap the side ends "A" of the portion between the source and drain regions by considering only the alignment shift, as shown in FIG. 1(c).

Example 2

Figure 7:
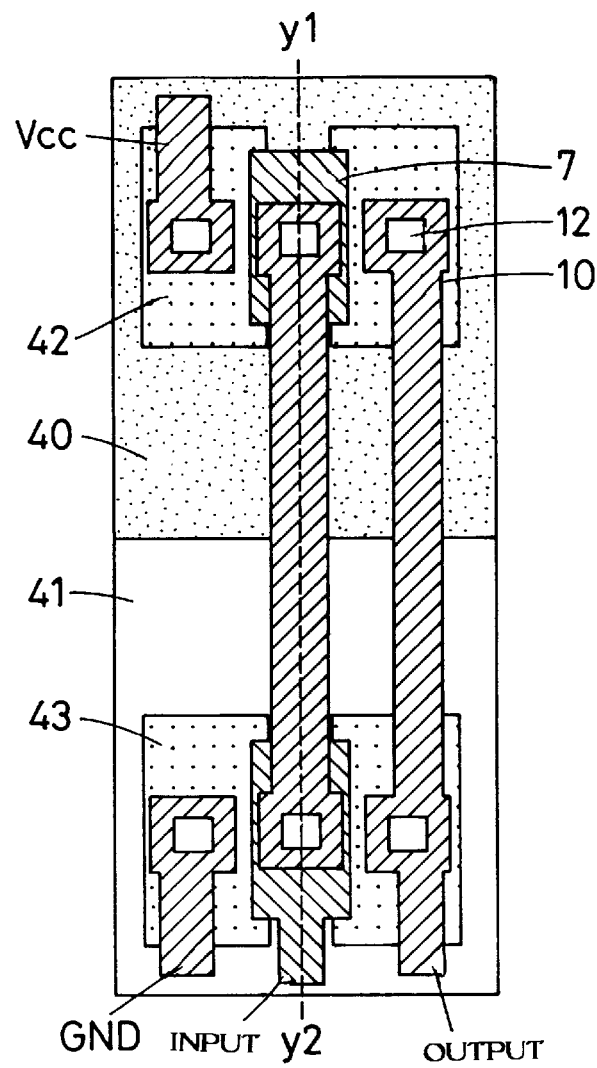
FIG. 7(a) is a plan view illustrating an invertor of CMOS structure employing the present invention.
FIG. 7(b) is a sectional view taken along a line Y1-Y2 in FIG. 7(a)
Figure 7:
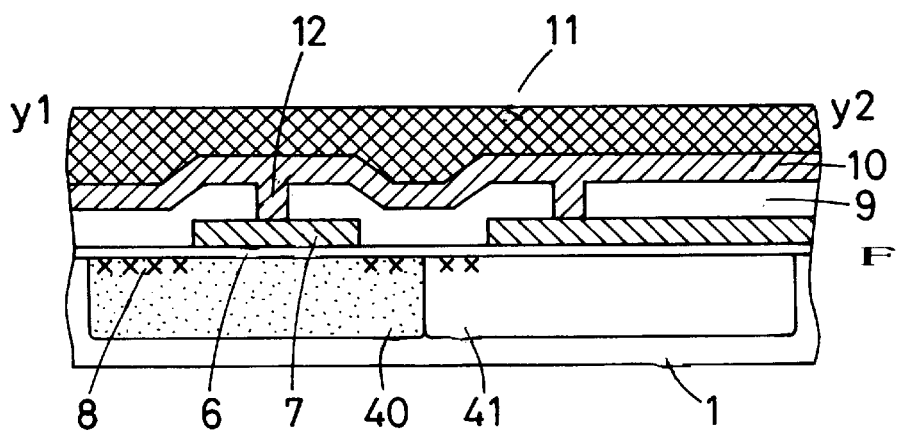

FIGS. 7(a) and 7(b) show an invertor of CMOS structure employing the semiconductor devices of the present invention. A P-type well 41 and an N-type well 40 are formed in a semiconductor substrate 1. MOS transistors 42 and 43 (which are examples of semiconductor elements) each include diffusion layers for source and drain regions, a gate insulation film 6, and a gate electrode formed in the wells 40 and 41, respectively. An element isolation region doped with an impurity is formed instead of a LOCOS film for isolation of the MOS transistors. The gate electrode of the N-channel MOSFET 43 in the P-type well 41 is connected to the gate electrode of the P-channel MOSFET 42 in the N-type well 40 via an interconnection layer 10. Since the interconnection layer 10 is formed on a boundary portion between the N-type well and the P-type well with intervention of an interlayer insulation film, the ion-implanted region for element isolation is not influenced by a voltage applied to the interconnection layer 10.

Example 3

Figure 8:
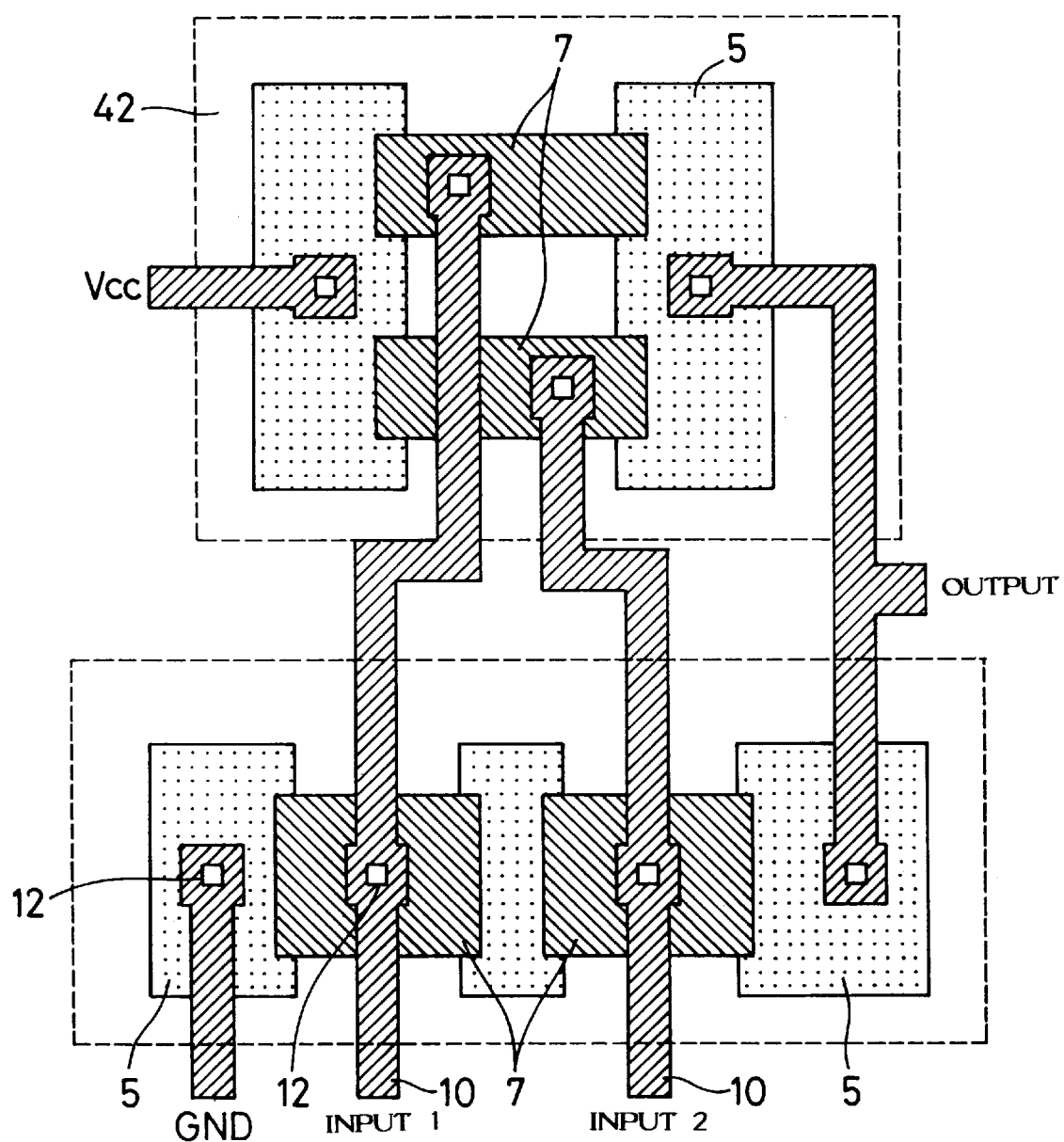
FIG. 8 is a plan view illustrating an NAND circuit employing the present invention.

FIG. 8 shows an NAND circuit employing the present invention. As shown in FIG. 8, the present invention allows for a highly flexible device layout and reduces the size of the NAND circuit in comparison with the prior art. In addition, the gate capacitance of the device is reduced.

In accordance with the present invention, the semiconductor device has a reduced-size gate electrode disposed opposite a semiconductor substrate thereof with an intervening gate insulation film. Therefore, the gate capacitance introduced between the gate electrode and the semiconductor substrate which are separated by the gate insulation film are reduced in comparison with the prior art.

Where the element isolation is achieved by ion implantation rather than by a LOCOS method, delay time may not be ignored due to the gate capacitance of the gate electrode in the prior art. In accordance with the present invention, however, the size of the gate electrode disposed opposite the semiconductor substrate with intervention of the gate insulation film is reduced as described above in comparison with the prior art. Therefore, the gate capacitance introduced between the gate electrode and the semiconductor substrate is reduced in comparison with the prior art, thereby alleviating the delay time. In addition, the semiconductor device has a relatively flat surface including smaller level differences. The present invention can be applied to a CMOS.

Further, since the gate electrode is allowed to contact the interconnection layer on the channel region and the interconnection layer is formed on the interlayer insulation film, the interconnection layer can extend across the source and drain regions. Thus, the present invention allows for more flexible layout and enhanced integration of the semiconductor devices.

Still further, in accordance with the present invention, the source and drain regions are formed by using a photoresist film as a mask before the patterning of the gate electrode. Even if the channel has such a short length as to impose difficulty in the prior art, the length of the channel is defined at the formation of the source and drain regions and, therefore, the size of the gate electrode can be determined independently of the length of the channel. Thus, by increasing only the size of the gate electrode, the interconnection layer can be readily connected to the gate electrode on the gate electrode.

The foregoing is of course just an illustration of the principles of the present invention. It will thus be appreciated that those skilled in the art will be able to devise various arrangements which, although not explicitly described or shown herein, embody the principles of the invention and thus are within its spirit and scope as defined in the claims set forth below.

What is claimed is:

1. A semiconductor device formed on a semiconductor substrate having one or more elements, each element comprising:

diffusion layers for source and drain regions formed in a surface portion of the semiconductor substrate;

a channel region located between the source and drain regions having a length along a first direction that intersects both the source and drain regions and a width along a second direction perpendicular to the first direction and that does not intersect both the source and drain regions;

a flat impurity region surrounding the source, drain, and channel regions forming a device isolation region to isolate the semiconductor device;

gate electrode formed on the semiconductor substrate with an intervening gate insulation film over the channel region and overlapping along the length of the channel region at least a portion of the source and drain regions;

an interlayer insulation film formed on the gate electrode; and an interconnection layer formed on the interlayer insulation film over the source, drain, and channel regions;

wherein a width of the gate electrode along the second direction is less tan the width of the channel region and the gate electrode is electrically connected to the interconnection layer via a contact hole formed directly over the channel region in the interlayer insulation film on the gate electrode.

2. The semiconductor device in claim 1, further comprising:

a plurality of the elements as defined in claim 1 formed on the semiconductor substrate, and an impurity region formed in a surface portion of the semiconductor substrate between a first one of the elements and a second, adjacent one of the elements so as to electrically isolate the first and second elements, wherein the interconnection layer is located on the impurity region with the interlayer insulation film formed between the interconnection layer and the impurity region for interconnecting the first element and the second, adjacent element.

3. A semiconductor device as set forth in claim 2, further comprising:

a first well region formed in a surface portion of the semiconductor substrate having a first conductivity; and a second well region formed in a surface portion of the semiconductor substrate having a second conductivity;

wherein the first well region and the second well region have a common gate electrode electrically connected to the interconnection layer via contact holes formed in the interlayer insulation film on the gate electrode.

4. A semiconductor device as set forth in claim 2, wherein the surface portion of the semiconductor substrate between the first and second elements is flat.

5. A semiconductor device as set forth in claim 1, wherein the width of the gate electrode along the second direction is substantially less than the width of the channel region along the second direction.

6. A semiconductor device formed on a semiconductor substrate having one or more elements, each element comprising:

diffusion layers for source and drain regions formed in a surface portion of the semiconductor substrate;

a channel region located between the source and drain regions having a length along a first direction that intersects both the source and drain regions and a width along a second direction perpendicular to the first direction and that does not intersect both the source and drain regions;

a flat impurity region surrounding the source, drain, and channel regions forming a device isolation region to isolate the semiconductor device;

a gate electrode formed on the semiconductor substrate with an intervening gate insulation film over the channel region and overlapping along the length of the channel region at least a portion of the source and drain regions, wherein the electrode has a shape that includes two portions having different lengths along the first direction;

an interlayer insulation film formed on the gate electrode; and an interconnection layer formed on the interlayer insulation film over the source, drain, and channel regions;

wherein a width of the gate electrode along the second direction is less than the width of the channel region and the gate electrode is electrically connected to the interconnection layer via a contact hole formed directly over the channel region in the interlayer insulation film on the gate electrode.

7. A semiconductor device as set forth in claim 6, wherein the gate electrode includes a first region surrounding the contact hole having a first length along the first direction greater than a second length along the first direction of a second region of the gate electrode adjacent to the first region.

* * * * *